United States Patent
Nguyen et al.

[11] Patent Number: 5,919,601
[45] Date of Patent: Jul. 6, 1999

[54] RADIATION-SENSITIVE COMPOSITIONS AND PRINTING PLATES

[75] Inventors: My T. Nguyen, Cliffwood; Shashikant Saraiya, Parlin; Frederic E. Mikell, Parsippany, all of N.J.; Ken-ichi Shimazu, Briarcliff Manor, N.Y.; S. Peter Pappas, Wood-Ridge, N.J.; Robert W. Hallman, Palisades Park, N.J.; Ajay Shah, Livingston, N.J.; Hans-Joachim Timpe, Osterode; Celin Savariar-Hauck, Badenhausen, both of Germany

[73] Assignee: Kodak Polychrome Graphics, LLC, Norwalk, Conn.

[21] Appl. No.: 08/745,534

[22] Filed: Nov. 12, 1996

[51] Int. Cl.⁶ .............. G03C 1/77; G03F 7/09; G03F 7/004
[52] U.S. Cl. .............. 430/278.1; 430/176; 430/270.1; 430/302; 430/926
[58] Field of Search .............. 430/270.1, 278.1, 430/926, 302, 176

[56] References Cited

U.S. PATENT DOCUMENTS

| | | | |
|---|---|---|---|
| 4,708,925 | 11/1987 | Newman | 430/270 |
| 4,927,741 | 5/1990 | Garth et al. | 430/309 |
| 5,059,512 | 10/1991 | Babich et al. | 430/926 |
| 5,085,972 | 2/1992 | Vogel | 430/270 |
| 5,286,612 | 2/1994 | Telfer | 430/335 |
| 5,340,699 | 8/1994 | Haley | 430/302 |
| 5,372,907 | 12/1994 | Haley et al. | 430/157 |
| 5,372,915 | 12/1994 | Haley et al. | 430/302 |
| 5,441,850 | 8/1995 | Marshall et al. | 430/336 |
| 5,466,557 | 11/1995 | Haley et al. | 430/278 |
| 5,491,046 | 2/1996 | DeBoer et al. | 430/302 |
| 5,618,892 | 4/1997 | Furihata et al. | 430/270.11 |

FOREIGN PATENT DOCUMENTS

| | | |
|---|---|---|
| 672954 | 9/1995 | European Pat. Off. . |
| 0773112 | 5/1997 | European Pat. Off. . |
| 0784233 | 7/1997 | European Pat. Off. . |
| 0819980 | 1/1998 | European Pat. Off. . |
| 0819985 | 1/1998 | European Pat. Off. . |
| 0823659 | 2/1998 | European Pat. Off. . |

*Primary Examiner*—John S. Chu
*Attorney, Agent, or Firm*—Ratner & Prestia

[57] ABSTRACT

Radiation-sensitive compositions, printing plates containing such compositions, imageable by infrared and ultraviolet/visible radiation and imaging method using same. The compositions comprise a thermal-activated acid generator; a crosslinking resin; a binder resin comprising a polymer containing reactive pendant groups selected from hydroxy, carboxylic acid, sulfonamide, and alkoxymethylamides; an infrared absorber; and optionally a UV/visible radiation-activated acid generator for UV/visible sensitization.

65 Claims, No Drawings

RADIATION-SENSITIVE COMPOSITIONS AND PRINTING PLATES

FIELD OF THE INVENTION

The invention relates to radiation-sensitive compositions, printing plates containing such compositions and methods for imaging same. Printing plates, e.g. aluminum substrates containing a layer of the radiation-sensitive composition on one surface thereof, may be readily imaged with an IR and/or UV/visible radiation source and thereafter developed.

BACKGROUND OF THE INVENTION

Printing plates containing radiation-sensitive compositions are well known. Such printing plates are imageable by infrared and/or UV/visible radiation. As a result of such radiation, the exposed area of a positive plate becomes more soluble in the developer than the non-exposed area (in a negative printing plate, the reverse is true).

Prior art examples disclosing radiation-sensitive compositions, and printing plates containing same, include U.S. Pat. Nos.: 4,708,925; 5,085,972; 5,286,612; 5,372,907; 5,372,915; 5,441,850; 5,466,557; 5,491,046; 5,340,699; and 5,466,557; and European Patent Application 0 672 954 A2.

U.S. Pat. No. 5,491,046 is an example of a printing plate containing a radiation-sensitive composition wherein the composition is comprised of a resole resin; novolac resin; latent Bronsted acid; and infrared absorber. However, the resin for such radiation-sensitive composition requires the combination of a resole and novolac resin. If, for example, the novolac resin is omitted, the image/exposure step will not provide a useful means of imaging, since subsequent contact with the developer will remove the coating from both the exposed and unexposed areas. Consequently, printing plates processed in such manner are not useful.

Moreover, these prior art printing plates require the use of highly alkaline developers which are prone to reaction with atmospheric carbon dioxide, thereby necessitating the use of sealed, specialized equipment. The prior art radiation-sensitive compositions also entail the use of low molecular weight, promoters, which may volatilize.

Printing plates containing the radiation-sensitive compositions of the present invention have several distinct advantages over printing plates containing the prior art compositions. In particular, the radiation sensitive composition for the printing plates of the present invention are not restricted to a particular resin system; are imageable by infrared or ultraviolet radiation sources; and employ developers that are easier to use. Therefore, the radiation-sensitive composition of the present invention provide greater processing latitude (e.g. temperature, dwell time, etc.) and a greater degree of flexibility in customizing the printing plates to meet the particular needs of each printer.

Finally, printing plates, containing the radiation-sensitive compositions of the present invention, have significantly greater press life (printing runs in excess of 100,000 copies) if not post-baked when compared with non-post-baked prior art printing plates. Such difference in press life is maintained when the plates are post-baked (as a general rule, post-baking extends the press life of printing plates).

SUMMARY OF THE INVENTION

The invention relates to radiation-sensitive compositions and to printing plates containing such composition wherein the compositions comprise: (a) a thermal-activated acid generator; (b) a crosslinking resin; (c) a binder resin comprising a polymer containing reactive pendant groups selected from hydroxy, carboxylic acid, sulfonamide, and alkoxymethylamide; and (d) an infrared absorber.

The radiation-sensitive compositions of the present invention are sensitive to infrared and ultraviolet (UV) radiation sources. However, where an UV radiation source is to be employed, the composition must additionally contain an UV/visible radiation-activated acid generator as a component. The invention also relates to a method of imaging printing plates employing said radiation-sensitive composition.

DESCRIPTION OF THE INVENTION

Printing plates containing the radiation sensitive compositions of the present invention are uniquely adapted for "direct-to-plate" imaging. Direct-to-plate systems utilize digitized information, as stored on a computer disk or computer tape, which is intended to be printed. The bits of information in a digitized record correspond to the image elements or pixels of the image to be printed. This pixel record is used to control an exposure device which may, for example, take the form of a modulated laser beam. The position of the exposure beam, in turn, may be controlled by a rotating drum, a leadscrew, or a turning mirror. The exposure beam is then turned off in correspondence with the pixels to be printed. The exposing beam is focused onto a presensitized unexposed plate. The exposed plate is then submitted to any required processing steps, such as removal of unexposed material, washing, baking, etc. to produce a printing plate ready for the printing press. The printing plate of the present invention is also suitable for use with conventional plate making, wherein the presensitized plate is exposed through an imaged film which it is in contact with, followed by any required plate processing steps.

The thermal-activated acid generator of the present invention promotes the matrix-forming reaction between the crosslinking resin and the binder resin, when the composition is exposed to a suitable radiation source. Thermal-activated acid generators suitable for use in the invention include, for example, straight or branched-chain $C_1$–$C_5$ alkyl sulfonates, aryl sulfonates, N—$C_1$–$C_5$ alkylsulfonyl sulfonamides, salts containing an onium cation and non-nucleophilic anion; and combinations thereof. Particularly useful aryl sulfonates include, for example, benzoin tosylate, 2-hydroxymethylbenzoin tosylate and 2,6-dinitrobenzyl tosylate. Particularly useful N-alkylsulfonyl sulfonamides include N-methanesulfonyl-p-toluene sulfonamide and N-methanesulfonyl-2,4-dimethylbenzene sulfonamide. Particularly useful salts include, for example, those in which the onium cation is selected from iodonium, sulphonium, phosphonium, oxysulphoxonium, oxysulphonium, sulphoxonium, ammonium and diazonium, and the non-nucleophilic anion is selected from tetra-fluoroborate, hexafluorophosphate, hexafluoroarsenate, hexafluoroantimonate, triflate, tetrakis(pentafluoro-phenyl) borate, pentafluoroethyl sulfonate, p-methyl-benzyl sulfonate, ethyl sulfonate, trifluoromethyl acetate and pentafluoroethyl acetate. Preferred are salts wherein the onium cation is iodonium or ammonium. The thermal-activated acid generator is incorporated in the composition of the invention in an amount of from about 1 to 25, preferably 5 to 20, weight percent (based on the weight of the composition).

Another component of the radiation sensitive composition of this invention is a crosslinking resin. Preferably, the crosslinking resin is selected from resole resins, $C_1$–$C_5$ alkoxymethyl melamine and glycoluril resins, poly($C_1$–$C_5$-alkoxy-methylstyrene), poly($C_1$–$C_5$-alkoxy-methylacrylamide) derivatives and combinations thereof.

More preferably, the crosslinking resin is a resole resin prepared from a $C_1$–$C_5$ alkylphenol and formaldehyde; a tetra $C_1$–$C_5$-alkoxymethyl glycoluril; polymers of (4-methoxymethylstyrene); [(N-methoxymethyl) acrylamide]; [(N-iso-butoxymethyl)acrylamide]; and butylated phenolic resins. The crosslinking resin is incorporated in the composition of this invention in an amount of from about 5 to 40, preferably 10 to 25, weight percent (based on the weight of the composition).

Another component of the radiation sensitive composition of this invention is a binder resin. Preferably, the binder resin is one or more polymers capable of undergoing an acid-catalyzed condensation reaction with the crosslinking resin at a temperature in the range of about 60–200° C. to form a crosslinked polymer. Suitable examples of such polymers include poly(4-hydroxystyrene), poly(4-hydroxystyrene/methylmethacrylate), novolac resin, poly(2-hydroxyethylmethacrylate/cyclohexylmethacrylate), poly (2-hydroxyethylmethacrylate/methylmethacrylate), poly (styrene/butylmethacrylate/methylmethacrylate/methacrylic acid), poly(butylmethacrylate/methacrylic acid), poly (vinylphenol/2-hydroxyethylmethacrylate), poly(styrene/n-butylmethacrylate/2-hydroxyethylmethacrylate/methacrylic acid), poly(styrene/ethylmethacrylate/2-hydroxyethylmethacrylate/methacrylic acid) and poly (N-methoxymethyl methacrylamide/2-phenylethyl methacrylate/methacrylic acid. The binder resin is present in an amount of about 20 to 65, preferably 30 to 55, weight percent (based on the weight of the composition). While not wishing to be bound by theory, it is believed that the crosslinking and binder resins are co-reactive resins. The designations of "binder resin" and "crosslinking resin" may therefor be used interchangeably.

The radiation sensitive composition of this invention also requires, as a component, an infrared absorber to render the composition sensitive to infrared radiation and cause the printing plate to be imagable by exposure to a laser source emitting in the infrared region. The infrared absorber can be a dye and/or pigment. A wide range of such compounds is well known in the art and include dyes and/or pigments selected from triarylamine dyes, thiazolium dyes, indolium dyes, oxazolium dyes, cyanine dyes, polyaniline dyes, polypyrrole dyes, polythiophene dyes, thiolene metal complex dyes, carbon black and polymeric phthalocyanine blue pigments. Where a dye and/or pigment is employed as the infrared absorber, it is used in an amount from about 2 to 30, preferably 5 to 20 weight percent (based on the weight of the composition).

As hereinabove explained, the radiation-sensitive composition of this invention may optionally be sensitized to UV/visible radiation by incorporating, as a component of the composition, a UV/visible radiation-activated acid generator. The incorporation of such acid generator renders a printing plate containing such composition imageable by a UV/visible radiation source. Suitable UV/visible radiation-activated acid generators may be selected from halo $C_1$–$C_5$ alkyl substituted S-triazines and salts containing an onium cation and non-nucleophilic anion. U.S. Pat. No. 5,491,046, incorporated herein by reference, describes halo $C_1$–$C_5$ alkyl substituted S-triazines suitable for use as UV/visible radiation-activated acid generators in the present invention. In the case where the UV/visible radiation-activated acid generator is a salt, the onium cation is preferably selected from iodonium, sulphonium, phosphonium, oxysulphoxonium, oxysulphonium, sulphoxonium, ammonium and diazonium, and the non-nucleophilic anion is preferably selected from tetrafluoroborate, hexafluorophosphate, hexafluoroarsenate, hexafluoroantimonate, triflate, tetrakis(pentafluorophenyl)borate, pentafluoroethyl sulfonate, p-methylbenzyl sulfonate, ethyl sulfonate, trifluoromethyl acetate and pentafluoroethyl acetate. The UV/visible radiation-activated acid generator is preferably incorporated in the composition of this invention in an amount of from about 0.5 to 10, preferably 1 to 5 weight percent, (based on the weight of the composition).

Other components which can optionally be incorporated in the composition of this invention include a UV/visible sensitizer; an indicator dye; and a secondary acid generator.

The UV/visible sensitizers suitable for use in this invention include, for example, monomolecular or polymeric compounds containing an anthracene moiety, thioxanthone moiety, or alkylaminobenzophenone moiety. Particularly useful molecular compounds include anthracene, 9-methylanthracene, 9-methoxyanthracene, 9,10-dimethoxyanthracene, thioxanthone, 2-chlorothioxanthone, 4-chlorothioxanthone, 2-isopropylthioxanthone, 4-isopropylthioxanthone, 2,4-diethylxanthone and 2-hydroxy-(3,4-dimethyl-9-oxo-9H-thioxanthone-2-yloxy)-N,N,N-trimethyl-1-propane ammonium chloride. Particularly useful polymeric compounds containing the anthracene moiety have the structure:

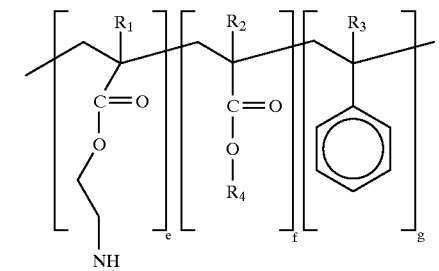

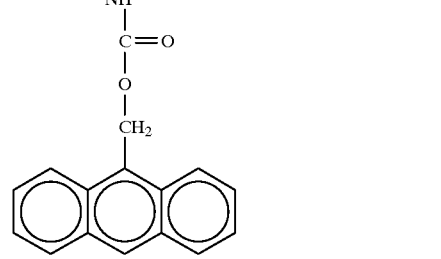

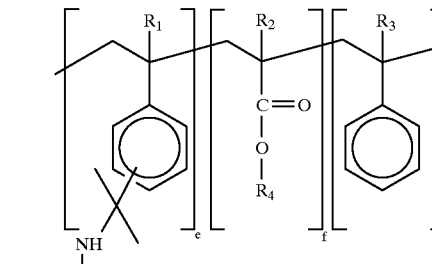

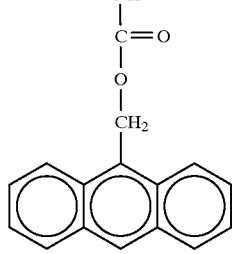

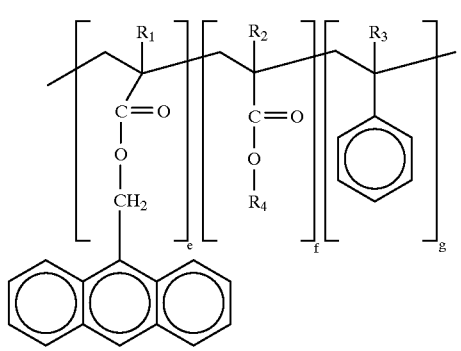

Particularly useful polymeric comnpounds containing the thioxanthone moiety have the structure:

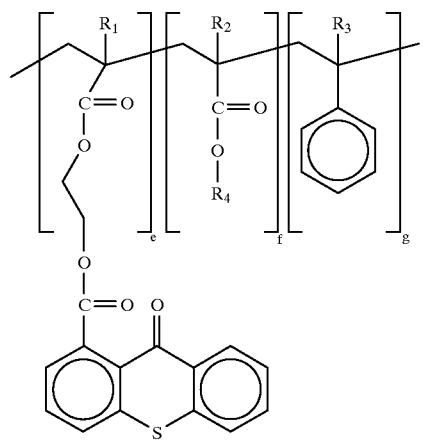

wherein $R_1$, $R_2$ and $R_3$ are independently selected from hydrogen or methyl groups; $R_4$ is a straight or branched-chain $C_1$–$C_{12}$ alkyl group, a $C_5$–$C_8$ cycloalkyl group, the moiety $(CH_2$—$CH_2$—$O)_a$—$G$, and combinations thereof; wherein G is phenyl or a $C_1$–$C_5$ straight or branched-chain alkyl group; and a is an integer from 1 to 6; and e has a value of 0.1 to 0.5, provided that the sum of e, f and g equal 1.0.

Suitable indicator dyes include, for example, Basic Blue 7, CI Basic Blue 11, CI Basic Blue 26, CI Disperse Red 1, CI Disperse Red 4 and CI Disperse Red 13. Preferably, the composition also contains an indicator dye which is present in an amount of about 0.05 to 10, preferably 0.1 to 5, wt. %, based on the weight of the composition.

Suitable secondary acid generators are those capable of undergoing an acid-catalyzed thermal decomposition to form additional acid. Secondary acid generators of this type include, for example, acetoacetate tosylate of acetoacetate and 1,3-dioxolane derivatives, a squaric acid derivative, or an oxalic acid derivatives. Particularly useful secondary acid generators include tert-butyl-2-methyl-2-(tosyloxymethyl)-acetoacetate, 2-phenyl-2-(2-tosyloxyethyl)-1,3-dioxolane and a 3,4-dialkoxycyclobut-3-ene-1,2-dione.

The compositions of the invention may be readily coated on a smooth or grained surface aluminum substrate to provide printing plates especially useful for lithographic printing processes.

To form printing plates, the compositions typically may be dissolved in an appropriate solvent or solvent mixture, to the extent of about 5 to 15 weight percent (based on the weight of the composition). Appropriate solvents or solvent mixtures include methyl ethyl ketone, methanol, methyl lactate, etc. Desirably, the coating solution will also contain a typical silicone-type flow control agent. The substrate, typically aluminum, may be coated by conventional methods, e.g. roll, gravure, spin or hopper coating processes, at the rate of about 10–30 meters/minute. The coated plate is dried with the aid of an airstream having a temperature of from about 60–100° C. for about 0.5 to 2 minutes. The resultant plate will contain a coating of the composition having a thickness of about 0.5 to 3 micrometers.

The printing plates of the invention may be image exposed by a radiation source that emits in the infrared region, i.e. between about 700 and 1,400 nm. As previously mentioned, the printing plates may also be exposed using conventional UV/visible radiation sources, provided a UV/visible radiation-activated acid generator is incorporated in the composition. These sources include carbon arc lamps, mercury vapor lamps, fluorescent lamps, tungsten lamps and photoflood lamps operating in the UV/visible spectrum between about 250 and 700 nm. Lasers using such sources provide a mechanism for scanning the write beam across the plate to generate an image. The intensity or power level of the write beam generated by the laser source ranges from 0.1 to 10 W.

During the writing operation, the plate to be exposed is placed in the retaining mechanism of the writing device and the write beam is scanned across the plate to generate an image. The imaged printing plate may then be hand developed or machine developed using conventional aqueous, alkaline developing solutions. Preferred aqueous developing solutions are commercially available. Negative developers, such as Polychrome® PC-952, as well as negative/positive developers, such as Polychrome® PC-9000 (Polychrome is a registered trademark of the Polychrome Corporation, Fort Lee, N.J.). After contact with the aqueous alkaline developing solution, the printing plate is usually treated with a finisher such as gum arabic.

The following nonlimiting examples shall serve to further illustrate the invention and are not intended to limit the scope thereof in any respect and should not be so construed. Unless otherwise indicated, all parts and percentages are on a weight basis.

EXAMPLE 1

A coating solution was prepared by dissolving 3.0 g poly(2-hydroxyethylmethacrylate/cyclohexylmethacrylate/methacrylic acid) (50/42.3/7.7 wt. %; synthesized in accordance with the procedure in Example 6) 3.0 g poly(vinylphenol/2-hydroxyethylmethacrylate) (available from Maruzen America, Inc., NY, N.Y.) 2.2 g tetramethoxymethyl glycoluril (available from Cytec Industries, Stamford, Conn.), 1.0 g 4-octyloxyphenyl, phenyl iodonium hexafluoroantimonate, 0.8 g infrared dye (Spectra IR 830 A, available from the Spectra Colors Corporation, Kearny, N.J.), 0.4 g Triazine-E and 0.02 g indicator dye (Victoria Blue BO, available from Aldrich Chemical Company, Milwaukee, Wis.) into 120 g of a solvent mixture containing 60% methyl ethyl ketone, 20% ethanol, 19.9% methyl cellosolve, and 0.1% surfactant (BYK 361, available from BYK Chemie, Wallingford, Conn.). The solution was spin-coated on the surfaces of two electro-grained aluminum substrates at 70 rpm and dried at 60° C. for 3 minutes to produce plates having a coating weight of between 1.6 and 2.0 g/m².

One plate was imaged with UV/visible light source having a maximum emission of about 380 nm and an energy density between 200 and 400 mJ/cm², while the other plate was imaged with an infrared laser diode having a wavelength of 830 nm at an energy density between 120 and 250 mJ/cm². Each imaged plate was heated at 125° C. for 60 seconds to induce the polycondensation reactions and then developed with an aqueous developer (Polychrome PC-T-153, all Polychrome developers available from the Polychrome Corporation, Fort Lee, N.J.) to give a clean printing image.

EXAMPLE 2

Example 1 was repeated, except that a modified hexamethoxymethyl melamine resin (Cymel 303, available from Cytec Industries, Stamford, Conn.) replaced the tetramethoxymethyl glycoluril. The solution was spin-coated on the surface of two electro-grained aluminum substrates at 70 rpm and dried at 60° C. for 3 minutes to produce plates having a coating weight of 1.8 g/m².

One plate was imaged with a UV/visible light source having a maximum emission of about 380 nm and an energy density between 200 and 400 mJ/cm², while the other plate was imaged with an infrared laser diode having a wavelength of 830 nm at an energy density between 120 and 250 mJ/cm². Each imaged plate was heated at 125° C. for 60 seconds to induce the polycondensation reactions and then developed with an aqueous developer (Polychrome PC-952) to give a clean printing image.

EXAMPLE 3

Example 1 was repeated, except that poly-(4-methoxymethylstyrene) replaced the tetramethoxymethyl glycoluril. The solution was spin-coated on the surface of two electro-grained aluminum substrates at 70 rpm and dried at 60° C. for 3 minutes to produce plates having a coating weight of 1.8 g/m².

One plate was imaged with UV/visible light source having a maximum emission of about 380 nm and an energy density between 200 and 400 mJ/cm², while the other plate was imaged with an infrared laser diode having a wavelength of 830 nm at an energy density between 120 and 250 mJ/cm². Each imaged plate was heated at 125° C. for 60 seconds to induce the polycondensation reactions and then developed with an aqueous developer (Polychrome PC-952) to give a clean printing image.

EXAMPLE 4

A coating solution was prepared by dissolving 1.35 g poly(vinylphenol/2-hydroxyethylmethacrylate) (available from Maruzen America, Inc., New York, N.Y.), 1.2 g poly (styrene/n-butylmethacrylate/2-hydroxy ethyl methacrylate/methacrylic acid) (33.5/7.65/51.0/7.85 wt. %; synthesized in accordance with the procedure in Example 6), 1.2 g poly (N-iso-butoxymethyl acrylamide/2-hydroxy ethyl methacrylate/methyl methyacrylate) (30/20/50 wt. %; synthesized) in accordance with the procedure in Example 6), 0.2 g anthracene, 1.0 g bis-4-dodecylphenyliodonium hexafluoro antimonate (available from the General Electric Company), 1.0 g infrared dye (Spectra IR830A), 1.0 g victoria blue R indicator dye into 85 g of a solvent mixture containing 60% methyl ethyl ketone, 20% methanol, 19.98% methyl cellosolve, and 0.02% surfactant (BYK 361). The solution was spin coated on two anodized grained aluminum substrates at 85 rpm and dried at 60° C. for 3 minutes to produce uniformly coated plates having a coating weight of between 1.2 and 1.6 g/m².

One plate was imaged with UV/visible light source having a maximum emission of about 380 nm and an energy density between 300 and 700 mJ/cm². The other plate was imaged with an infrared laser diode having a wavelength of 830 nm at an energy density between 120 and 250 mJ/cm². Each imaged plate was heated at 125° C. for 1 to 3 minutes to induce the polycondensation reactions and then developed with an aqueous developer (Polychrome PC-T-153) to give a clean printing image.

EXAMPLE 5

Propylene glycol methyl ether acetate (Arcosolve PMAcetate, available from the Arco Chemical Corporation), 15 g of m-TMI (available from Cytec Industries, Stamford, Conn.), 25 g of methylmethacrylate and 10 g of butylmethacrylate and 2 g of t-butyl peroxy benzoate, were heated to 120° C. in a 500 ml flask. A mixture of 45 g of m-TMI, 75 g of methyl methacrylate, 30 g butyl methacrylate and 4 g of t-butyl peroxy benzoate, was then added dropwise over a 120 minute period. Next, 6 g of t-butyl peroxy benzoate was added in an 8 hour period to complete the reaction. The reaction was continued for an additional 2 hours to achieve an intermediate having a theoretical non-volatile percentage of about 60% and cooled to room temperature. The viscosity of the intermediate was 1650 centipoise.

300 g of the intermediate was added to 35.86 g of Arcosolve PMAcetate and 1.17 g of dibutyltindilurate as a catalyst and the mixture was heated to 40° C. 53.5 g of 9-anthracenemethanol were added. The reaction was complete in 10 hours, monitored by the disappearance of -NCO functional group by IR analysis. The reaction mixture was precipitated in hexane to obtain the final product in powder form.

EXAMPLE 6

200 g of methyl cellosolve, containing 25 g of N-methoxymethyl methacrylamide, 16.7 g 2-(phenylethyl) methacrylate, 3 g methacrylamide, 1.3 g of azobutyronitrile and 0.4 g of dodecyl mercaptan was heated under nitrogen at 80° C. Thereafter, a mixture of 50 g N-methoxymethyl methacrylamide, 33.4 g 2-(phenylethyl) methacrylate and 6 g of methacrylic acid was slowly added dropwise to the solution over a 2 hour period. Next, 0.3 g of azobutyronitrile, and 2 hours later, another 0.3 g of azobutyronitrile was added with stirring at 80° C. After 2 hours of additional heating, the solution was allowed to cool to room temperature. The final polymer product was precipitated in 1.5 liters of water, filtered, washed with water and air dried at room temperature. The polymer exhibited an acid number of 43 mg KOH/g (calculated value: 44 mg KOH/g).

EXAMPLE 7

A mixture of 49.6 g of N-methoxymethyl methacrylamide, 27.3 g styrene, 15 g butyl methacrylate, 7.7 g methacrylic acid, 0.25 g dodecyl mercaptan was heated under nitrogen at 80° C. The mixture (25%) was dissolved in 150 g methyl cellosolve and 0.5 g azobutyronitrile and heated under nitrogen with stirring at 80° C. The residual 75% of the pre-mixed monomers and 1 g azobutyronitrile was added over a 2 hour period. Then 0.13 g of azobutyronitrile was added and the mixture was heated for an additional 2 hours under nitrogen and allowed to cool to room temperature. The final polymer product was precipitated in 1.5 liters of water, filtered, washed with water and air dried at 40° C. The polymer exhibited an acid number of 54 mg KOH/g (calculated value: 45 mg KOH/g).

EXAMPLE 8

A coating solution was prepared by dissolving of 10.2 g of polymer of example 6, 5.1 g cresol resole (Bakelite Resin 9900 LB available from Georgia Pacific Resins, Incorporated, Elk Grove, Calif.), 3.0 g N-ethoxy isoquinolinium hexafluorophosphate, 1.6 g infrared dye (Spectra IR 830 A) and 0.05 g indicator dye (Victoria Blue BO, available from Aldrich Chemical Company, Milwaukee, Wis.) into 150 g of a solvent mixture containing 45% methanol, 30% methyl cellosolve and 25% methyl ethyl ketone. After filtering the solution it is applied to electrochemically roughened and anodized aluminum foils that were subject to an after treatment using an aqueous solution of poly(vinyl phosphonic acid) by means of a wire coater. The coatings were dried at 80° C. for 4 minutes to produce plates having a coating weight of between 1.5 and 1.8 g/m$^2$.

One plate was imaged with ultraviolet light between 340 and 420 nm and an energy density between 200 and 400 mJ/cm$^2$, while the other plate was imaged with an infrared laser diode having a wavelength of 830 nm at an energy density between 150 and 250 mJ/cm$^2$. Each imaged plate was heated to 130° C. for 60 seconds to induce the polycondensation reactions and then developed with an aqueous developer (Polychrome PC-952) to give a clean printing image.

EXAMPLE 9

A coating solution was prepared by dissolving of 5.0 g of polymer of Example 7, 6.0 g of an alkyl phenol resole (Bakelite 9435 LA available from Georgia Pacific Resins, Incorporated, Elk Grove, Calif.), 2.0 g (4-octyloxyphenyl)-phenyliodonium hexafluoroantimonate, 1.0 g infrared dye (Spectra IR 830 A) and 0.05 g indicator dye (Victoria Blue BO, available from Aldrich Chemical Company, Milwaukee, Wis.) into 100 g of a solvent mixture containing 45% methanol, 30% methyl cellosolve and 25% methyl ethyl ketone. After filtering the solution, it is applied to an electrochemically roughened and anodized aluminum foil that was sealed with poly(vinyl phosphonic acid) by means of a wire coater. The coating was dried at 80° C. for 4 minutes to produce a plate having a coating weight of between 1.5 and 1.7 g/m$^2$.

The plate was imaged with an infrared laser diode having a wavelength of 830 nm at an energy density between 150 and 250 mJ/cm$^2$. After imaging, the plate was heated to 130° C. for 60 seconds to induce the polycondensation reactions and then developed with an aqueous developer (Polychrome PC-9000) to give a clean printing plate.

EXAMPLE 10

Example 9 was repeated, except that a condensation product of formaldehyde and 4-toluenesulphonamide (Akzo Ketjenflex MS80, available from the Akzo Chemical Company) replaced the alkyl phenol resole. The solution was wire-coated to electro-grained, anodized and with poly(vinyl phosphonic acid) sealed aluminum foil and dried at 80° C. for 4 minutes to produce a plate having a coating weight of 1.6 g/m$^2$.

The plate was imaged with a diode infrared laser having a wavelength of 830 nm at an energy density between 125 and 250 mJ/cm$^2$. After exposure, the plate was heated at 135° C. for 60 seconds to induce the polycondensation reactions and then developed with an aqueous developer (Polychrome PC-956) to give a clean printing image.

EXAMPLE 11

A coating solution was prepared by dissolving of 10.2 g of polymer of Example 6, 4.7 g of a formaldehyde arylsulfonamide condensate (Reichold 44-444, available from the Reichold Chemical Company), 3.2 g dicumyliodonium hexafluorophosphate, 1.6 g infrared dye (Spectra IR 830A) and 0.05 g indicator dye (Victoria Blue BO, available from Aldrich Chemical Company, Milwaukee, Wis.) into 150 g of a solvent mixture containing 45% methanol, 30% methyl cellosolve and 25% methyl ethyl ketone. After filtering the solution, it is applied to electrochemically roughened and anodized aluminum foils that were post-treated with an aqueous solution of poly(vinyl phosphonic acid) by means of a wire coater. The coatings were dried at 80° C. for 4 minutes to produce plates having a coating weight of between 1.5 and 1.7 g/m$^2$.

The plates were imaged with an infrared laser diode having a wavelength of 830 nm at an energy density between 150 and 250 mJ/cm$^2$. After exposure, the plates were heated at 130° C. for 60 seconds to induce the polycondensation reactions and then developed with an aqueous developer (Polychrome PC-952) to give a clean printing image.

EXAMPLE 12

A coating solution was prepared by dissolving 1.4 g poly(vinylphenol/2-hydroxyethylmethacrylate) (available from Maruzen America, Inc. New York, N.Y.), 2.0 g poly(styrene/n-butylmethacrylate/methacrylic acid/N-methoxymethyl methacrylamide) (synthesized in accordance with the procedure in Example 7), 1.0 g iodonium hexafluoroantimonate salt (CD1012, available from Sartomer Company, Exton, Pa.), 0.5 g infrared dye (Spectra IR 830A), 0.02 g solvent (Blue 35, available from the Spectra Colors Corporation, Kearny, N.J.) into 85 g solvent mixture containing 60% methyl ethyl ketone, 20% methanol, 19.9% methyl cellosolve, and 0.01% surfactant (BYK 361, available from BYK Chemie, Wallingford, Conn.). The solution was spin coated on the surface of the grained aluminum substrate at 85 rpm and dried at 60° C. for 3 minutes to produce plates having a coating weight of between 1.2 and 1.6g/m$^2$.

The plate was imaged with a laser diode image setter (Creo Trendsetter) at the energy between 140 and 250 mJ/cm$^2$. The imaged plate was heated to 125° C. with the speed of 1.6 ft/min. The plate was then developed with an aqueous developer (Polychrome T-153) using a Polychrome Quartz processor to give a high resolution printing plate.

EXAMPLE 13

A coating solution was prepared by dissolving 0.50 g poly(2-hydroxyethylmethacrylate/cyclohexylmethacrylate) (43.6/56.4 wt. %; synthesized in accordance with the procedure in Example 6), 0.2 g poly(styrene/butylmethacrylate/methylmethacrylate/methacrylic acid) (17/17/51/15 wt. %; synthesized in accordance with the procedure in Example 6), 0.2 g tetramethoxymethyl glycoluril, 0.4 g triarylsulphonium hexafluoro-antimonate (CD1010, available from Sartomer Company, Exton, Pa.), 0.15 g heptamethine cyanine infrared dye and 0.02 g CI Basic Blue 26 indicator dye in 25 ml of a solvent mixture consisting of 60% methyl ethyl ketone, 20% methanol, 19.9% methyl cellosolve and 0.1% surfactant (BYK 361, available from BYK Chemie, Wallingford, Conn.). The solution was spin-coated on the surface of an electrograined aluminum substrate and dried at 60° C. for 3 minutes to produce a coating weight of about 1.8 g/m$^2$.

The plate was imaged with an infrared laser diode having a wavelength of 830 nm at an energy density level between 100 and 400 mJ/cm$^2$. The imaged plate was heated at 100° C. for 90 seconds to induce the polycondensation reactions and then developed with an aqueous developer (Polychrome PC4400) to give a clean printing image.

EXAMPLE 14

Example 13 was repeated using a modified hydroxymethyl melamine resin (Cymel 303, available from Cytec Industries, Incorporated, Stamford, Conn.) in place of the tetramethoxymethyl glycoluril. The solution was spin-coated on the surface of an electrograined aluminum substrate and dried at 60° C. for 3 minutes to produce a coating weight of about 1.8 g/m².

The plate was imaged with a diode infrared laser having a wavelength of 830 nm at an energy density level between 100 and 400 mJ/cm². The imaged plate was heated at 100° C. for 90 seconds to induce the polycondensation reactions and then developed with an aqueous developer (Polychrome PC4400) to give a clean printing image.

EXAMPLE 15

A coating solution was prepared similar to that of Example 13, except that infrared dye (Epolite-178, available from Epolin, Incorporated, Newark, N.J.) was used instead of the heptamethine cyanine infrared dye. The solution was spin-coated on the surface of an electrograined aluminum substrate and dried at 60° C. for 3 minutes to produce a coating weight of about 1.8 g/m².

The plate was imaged with a YAG infrared laser using a wavelength of 1064 nm and an energy density between 100 and 400 mJ/cm². The imaged plate was heated at 100° C. for 90 seconds to induce the polycondensation reactions and thereafter developed with an aqueous developer (Polychrome PC 4400) to give a clean printing image.

EXAMPLE 16

A coating solution was prepared similar to that of Example 13, except that triarylsulphonium hexafluoroantimonate (available from the General Electric Company) was replaced by bis-4-dodecylphenyl iodonium hexafluoroantimonate. The solution was spin-coated on electrograined aluminum at 70 rpm and dried at 60° C. for 3 minutes to give a coating weight of 1.8 g/cm².

The plate was imaged with an infrared laser diode having a wavelength of 830 nm at an energy density level between 100 and 400 mJ/cm². The imaged plate was heated at 100° C. for 90 seconds to induce the polycondensation reactions and then developed with an aqueous developer (Polychrome PC4400) to give a clean printing image.

EXAMPLE 17

A coating solution was prepared similar to that of Example 13, except that triarylsulphonium hexafluoroantimonate was replaced by benzoin tosylate. The solution was spin-coated on electrograined aluminum at 70 rpm and dried at 60° C. for 3 minutes to give a coating weight of 1.8 g/cm².

The plate was imaged with an infrared laser diode having a wavelength of 830 nm at an energy density level between 100 and 400 mJ/cm². The imaged plate was heated at 100° C. for 90 seconds to induce the polycondensation reactions and then developed with an aqueous developer (Polychrome PC4400) to give a clean printing image.

EXAMPLE 18

153.4 g of 2-methoxyethanol, 7.5 g of N-(isobutoxymethyl) acrylamide (available from Cytec Industries Incorporated, Stamford, Conn.), 5 g of hydroxyethyl methacrylate, 12.5 g of methylmethacrylate, 0.5 g of Vazo-64 (available from the DuPont de Nemours Company, Wilmington, Del.) and 0.063 g of dodecylmercaptan were heated to 80° C. Then a premixed mixture of 22.5 g of N-(isobutoxymethyl) acrylamide, 15 g of hydroxyethylmethyacrylate, 37.5 g of methylmethacrylate, 1.0 g of Vazo-64 and 0.19 g of dodecylmercaptane were added in 90 minutes dropwise at 80° C. After the addition complete, a total of 0.5 g of Vazo-64 was added to complete the reaction. The reaction was completed to theoretical % non-volatile (40%) in four and a half hours, then batch was cooled to room temperature. The viscosity of the resulting product was 2020 centipoise. The reaction mixture was precipitated in powder form using water/ice and product was used for evaluation.

EXAMPLE 19

Example 12 was repeated, except that poly(styrene/n-butylmethacrylate/methacrylic acid/N-methoxymethylmethacrylamide) was replaced with poly(styrene/n-butylmethacrylate/methacrylic acid/N-isobutoxymethylmethacrylamide) (synthesized in accordance with the procedure in Example 7 with N-isobutoxymethyl methacrylamide used in place of N-methoxymethylmethacrylamide). The solution was spin coated on the surface of the grained aluminum substrate at 85 rpm and dried at 60° C. for 3 minutes to produce plates having a coating weight of between 1.2 and 1.6 g/m².

The plate was imaged with a laser diode image setter (Creo Trendsetter) at the energy between 140 and 250 mJ/cm². The imaged plate was heated to 125° C. with the speed of 1.6 ft/min. The plate was then developed with a Polychrome T-153 developer using a Polychrome Quartz processor to give a high resolution printing plate.

EXAMPLE 20

Example 12 was repeated, except that the infrared dye (Spectra IR 830A) was replaced with infrared dye IR-140 (available from Aldrich Chemical, Milwaukee, Wis.). The solution was spin coated on the surface of the grained aluminum substrate at 85 rpm and dried at 60° C. for 3 minutes to produce plates having a coating weight of between 1.2 and 1.6 g/m².

The plate was imaged with a laser diode image setter (Creo Trendsetter) at the energy between 140 and 250 mJ/cm². The imaged plate was heated to 125° C. with the speed of 1.6 ft/min. The plate was then developed with an aqueous developer (Polychrome T-153) using a Polychrome Quartz processor to give a high resolution printing plate.

EXAMPLE 21

Example 12 was repeated, except that the infrared dye (Spectra IR 830A) was replaced with the infrared dye (Epolite III-178, available from Epoline, Newark, N.J.). The solution was spin coated on the surface of the grained aluminum substrate at 85 rpm and dried at 60° C. for 3 minutes to produce plates having a coating weight of between 1.2 and 1.6 g/m².

The plate was imaged with a laser diode image setter (Creo Trendsetter) at the energy between 140 and 250 mJ/cm². The imaged plate was heated to 125° C. with the speed of 1.6 ft/min. The plate was then developed with a Polychrome T-153 developer using a Polychrome Quartz processor to give a high resolution printing plate.

The present invention has been described in detail, including the preferred embodiments thereof. However, it will be appreciated that those skilled in the art, upon consideration of the disclosures herein, may make modifications and/or improvements on this invention that fall within the scope and spirit of the invention as set forth in the following claims.

What is claimed is:

1. A radiation-sensitive composition comprising:
   (a) a thermal-activated acid generator;
   (b) a crosslinking resin;
   (c) a binder resin comprising a polymer containing first reactive pendant groups capable of undergoing acid-catalyzed condensation with the crosslinking resin at a temperature in the range of about 60–200° C. to form a crosslinked polymer, said first reactive pendant groups selected from the group consisting of carboxylic acid, sulfonamide, and alkoxymethyl amide; and (d) an infrared absorber.

2. The composition of claim 1 wherein the thermal-activated acid generator is selected from: straight or branched-chain $C_1$–$C_5$ alkyl sulfonates; aryl sulfonates; straight or branched chain N—$C_1$–$C_5$ alkylsulfonyl sulfonamides; salts containing an onium cation and non-nucleophilic anion; and combinations thereof.

3. The composition of claim 2 wherein the salt contains an onium cation selected from iodonium, sulphonium, phosphonium, oxysulphoxonium, oxysulphonium, sulphoxonium, ammonium and diazonium.

4. The composition of claim 3 wherein the ammonium cation is an N-alkoxy nitrogen containing heterocyclic compound.

5. The composition of claim 2 wherein the salt contains a non-nucleophilic anion selected from tetrafluoroborate, hexafluorophosphate, hexafluoroarsenate, hexafluoroantimonate, triflate, tetrakis(pentafluorophenyl) borate, pentafluoroethyl sulfonate, p-methylbenzene sulfonate, ethyl sulfonate, trifluoromethyl acetate and pentafluoroethyl acetate.

6. The composition of claim 2 wherein the acid generator is N-ethoxy isoquinolinium hexafluorophosphate.

7. The composition of claim 2 wherein the acid generator is 4-octyloxyphenyl phenyliodonium hexafluoroantimonate.

8. The composition of claim 1 wherein the crosslinking resin is selected from resole resins, $C_1$–$C_5$ alkoxymethyl melamine resins, $C_1$–$C_5$ alkoxymethyl glycoluril resins, poly($C_1$–$C_5$ alkoxymethyl styrene), polymers of 4-methoxymethyl styrene, polymers of (N-methoxymethyl) acrylamide, polymers of (N-methoxymethyl) methacrylamide, polymers of (N-iso-butoxymethyl) acrylamide, poly($C_1$–$C_5$ alkoxymethyl (meth)acrylamide) derivatives, butylated phenolic resins, and combinations thereof.

9. The composition of claim 1 wherein the infrared absorber is a dye or pigment having a strong absorption band in the region between 700 and 1400 nm.

10. The composition of claim 9 wherein the dye or pigment is selected from triarylamine dyes, thiazolium dyes, indolium dyes, oxazolium dyes, cyanine dyes, polyaniline dyes, polypyrrole dyes, polythiophene dyes, thiolene metal complex dyes, carbon black and polymeric phthalocyanine blue pigments.

11. The composition of claim 1 further comprising a UV/visible radiation-activated acid generator.

12. The composition of claim 11 wherein the UV/visible radiation-activated acid generator is selected from halo $C_1$–$C_5$ alkyl substituted S-triazines; salts containing an onium cation and non-nucleophilic anion; and combinations thereof.

13. The composition of claim 12 wherein the onium cation is selected from iodonium, sulphonium, phosphonium, oxysulphoxonium, oxysulphonium, sulphoxonium, ammonium and diazonium.

14. The composition of claim 12 wherein the non-nucleophilic anion is selected from tetrafluoroborate, hexafluorophosphate, hexafluoro-arsenate, hexafluoroantimonate, triflate, tetrakis(penta-fluorophenyl) borate, pentafluoroethyl sulfonate, p-methylbenzene sulfonate, ethyl sulfonate, trifluoro-methyl acetate and pentafluoroethyl acetate.

15. The composition of claim 11 further comprising a UV/visible sensitizer selected from monomolecular or polymeric compounds containing an anthracene moiety, thioxanthone moiety, or alkylaminobenzophenone moiety.

16. The composition of claim 15 wherein the monomolecular compound is selected from anthracene, 9-methylanthracene, 9-methoxyanthracene, 9,10-dimethoxyanthracene, thioxanthone, 2-chlorothioxanthone, 4-chlorothioxanthone, 2-isopropylthioxanthone, 4-isopropyl-thioxanthone, 2,4-diethylthioxanthone and 2-hydroxy-(3,4-dimethyl-9-oxo-9H-thioxanthone-2-yloxy)-N,N,N-trimethyl-1-propane ammonium chloride.

17. The composition of claim 15 wherein the polymeric compound contains an anthracene moiety having the structure:

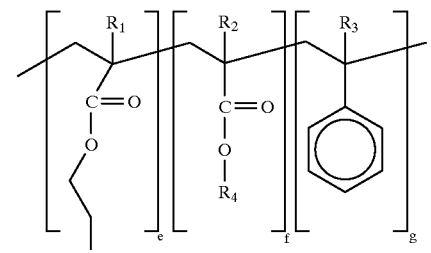

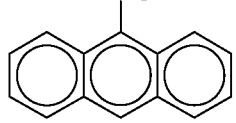

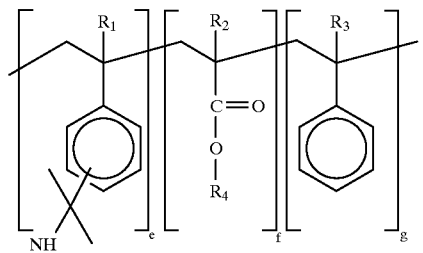

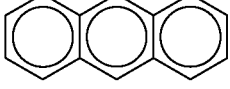

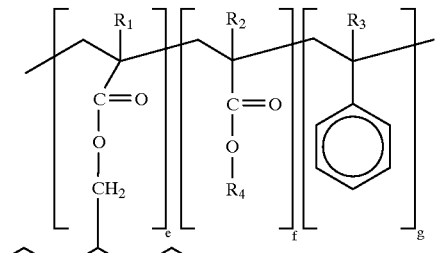

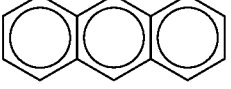

wherein $R_1$, $R_2$ and $R_3$ are independently selected from hydrogen or methyl groups; $R_4$ is a straight or branched-chain $C_1$–$C_{12}$ alkyl group, a $C_5$–$C_8$ cycloalkyl group, the moiety $(CH_2\text{—}CH_2\text{—}O)_a\text{—}G$, and combinations thereof; wherein G is phenyl or a $C_1$–$C_5$ straight or branched-chain alkyl group; and a is an integer from 1 to 6; and e has a value of 0.1 to 0.5, provided that the sum of e, f and g equal 1.0.

18. The composition of claim 15 wherein the polymeric compound containing the thioxanthone moiety has the structure:

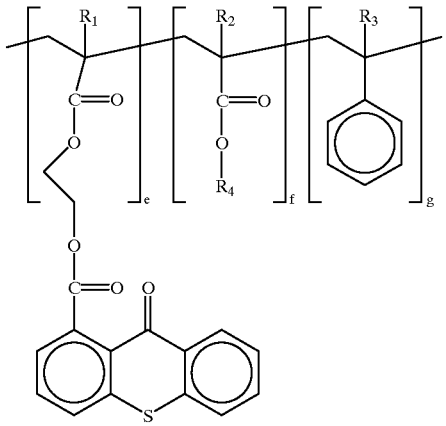

wherein $R_1$, $R_2$ and $R_3$ are independently selected from hydrogen or methyl groups; R is a straight or branched-chain $C_1$–$C_{12}$ alkyl group, a $C_5$–$C_8$ cycloalkyl group, the moiety $(CH_2\text{—}CH_2\text{—}O)_a\text{—}G$, and combinations thereof; wherein G is phenyl or a $C_1$–$C_5$ straight or branched-chain alkyl group; and a is an integer from 1 to 6; and e has a value of 0.1 to 0.5, provided that the sum of e, f and g equal 1.0.

19. The composition of claim 1 further comprising a secondary acid generator capable of undergoing an acid-catalyzed reaction to form additional acid.

20. The composition of claim 19 wherein the secondary acid generator is selected from acetoacetate, a squaric acid derivative, or an oxalic acid derivative.

21. The composition of claim 20 wherein the secondary acid generator is selected from tert-butyl-2-methyl-2-(tosyloxymethyl)acetoacetate, 2-phenyl-2-(2-tosyloxyethyl)-1,3-dioxolane and a 3,4-dialkoxycyclobut-3-ene-1,2-dione.

22. The composition of claim 1 further comprising an indicator dye.

23. The composition of claim 22 wherein the indicator dye is selected from CI Basic Blue 7, CI Basic Blue 11, CI Basic Blue 26, CI Disperse Red 1, CI Disperse Red 4 and CI Disperse Red 13.

24. A printing plate comprising an aluminum substrate having a layer of a radiation-sensitive composition comprising:
(a) a thermal-activated acid generator;
(b) a crosslinking resin;
(c) a binder resin comprising a polymer containing first reactive pendant groups capable of undergoing acid-catalyzed condensation with the crosslinking resin at a temperature in the range of about 60–200° C. to form a crosslinked polymer, said first reactive pendant groups selected from the group consisting of carboxylic acid, sulfonamide, and alkoxymethyl amide; and
(d) an infrared absorber.

25. The printing plate of claim 24 wherein the thermal-activated acid generator is selected from straight or branched-chain $C_1$–$C_5$ alkyl sulfonates; aryl sulfonates; N—$C_1$–$C_5$ alkyl sulfonyl sulfonamides; salts containing an onium cation and a non-nucleophilic anion; and combinations thereof.

26. The printing plate of claim 24 wherein the salt contains an onium cation selected from iodonium, sulphonium, phosphonium, oxysulphoxonium, oxysulphonium, sulphoxonium, ammonium and diazonium.

27. The printing plate of claim 26 wherein the onium cation is an N-alkoxy nitrogen containing heterocyclic compound.

28. The printing plate of claim 24 wherein the salt contains a non-nucleophilic anion selected from tetrafluoroborate, hexafluorophosphate, hexafluoroarsenate, hexafluoroantimonate, triflate, tetrakis(pentafluorophenyl)borate, pentafluoroethyl sulfonate, p-methylbenzene sulfonate, ethyl sulfonate, trifluoromethyl acetate and pentafluoroethyl acetate.

29. The printing plate of claim 25 wherein the acid generator is N-ethoxy isoquinolinium hexafluorophosphate.

30. The printing plate of claim 25 wherein the acid generator is 4-octyloxyphenyl phenyliodonium hexafluoroantimonate.

31. The printing plate of claim 24 wherein the crosslinking resin is selected from resole resins, $C_1$–$C_5$ alkoxymethyl melamine resins, $C_1$–$C_5$ alkoxymethyl glycoluril resins, poly($C_1$–$C_5$alkoxymethyl styrene), polymers of 4-methoxymethyl styrene, polymers of (N-methoxymethyl) acrylamide, polymers of (N-methoxymethyl) methacrylamide, polymers of (N-iso-butoxymethyl) acrylamide, poly($C_1$–$C_5$alkoxymethyl (meth)acrylamide) derivatives, butylated phenolic resins, and combinations thereof.

32. The printing plate of claim 24 wherein the infrared absorber is a dye or pigment having a strong absorption band in the region between about 700 and 1400 nm.

33. The printing plate of claim 32 wherein the dye or pigment is selected from triarylamine dyes, thiazolium dyes, indolium dyes, oxazolium dyes, cyanine dyes, polyaniline dyes, polypyrrole dyes, polythiophene dyes, thiolene metal complex dyes, carbon black and polymeric phthalocyanine blue pigments.

34. The printing plate of claim 24 further comprising a UV/visible radiation-activated acid generator.

35. The printing plate of claim 34 wherein the UV/visible radiation-activated acid generator is selected from halo $C_1$–$C_5$ alkyl substituted S-triazines; salts containing an onium cation and non-nucleophilic anion; and combinations thereof.

36. The printing plate of claim 35 wherein the onium cation is selected from iodonium, sulphonium, phosphonium, oxysulphoxonium, oxysulphonium, sulphoxonium, ammonium and diazonium.

37. The printing plate of claim 35 wherein the non-nucleophilic anion is selected from tetrafluoroborate, hexafluorophosphate, hexafluoro-arsenate, hexafluoro antimonate, triflate, tetrakis (pentafluorophenyl)borate, pentafluoroethyl sulfonate, p-methylbenzene sulfonate, ethylsulfonate, trifluoromethyl acetate and pentafluoroethyl acetate.

38. The printing plate of claim 34 further comprising a UV/visible sensitizer selected from monomolecular or polymeric compounds containing an anthracene moiety, thioxanthone moiety or alkylaminobenzophenone moiety.

39. The printing plate of claim 38 wherein the monomolecular compound is selected from anthracene, 9-methylanthracene, 9-methoxyanthracene, 9,10-dimethoxyanthracene, thioxanthone, 2-chlorothioxanthone, 4-chlorothioxanthone, 2-isopropylthioxanthone, 4-isopropylthioxanthone, 2,4-diethylthioxanthone and 2-hydroxy-(3,4-dimethyl-9-oxo-9H-thioxanthone-2-yloxy)-N,N,N-trimethyl-1-propane ammonium chloride.

40. The printing plate of claim 38 wherein the polymeric compound containing the anthracene moiety has the structure:

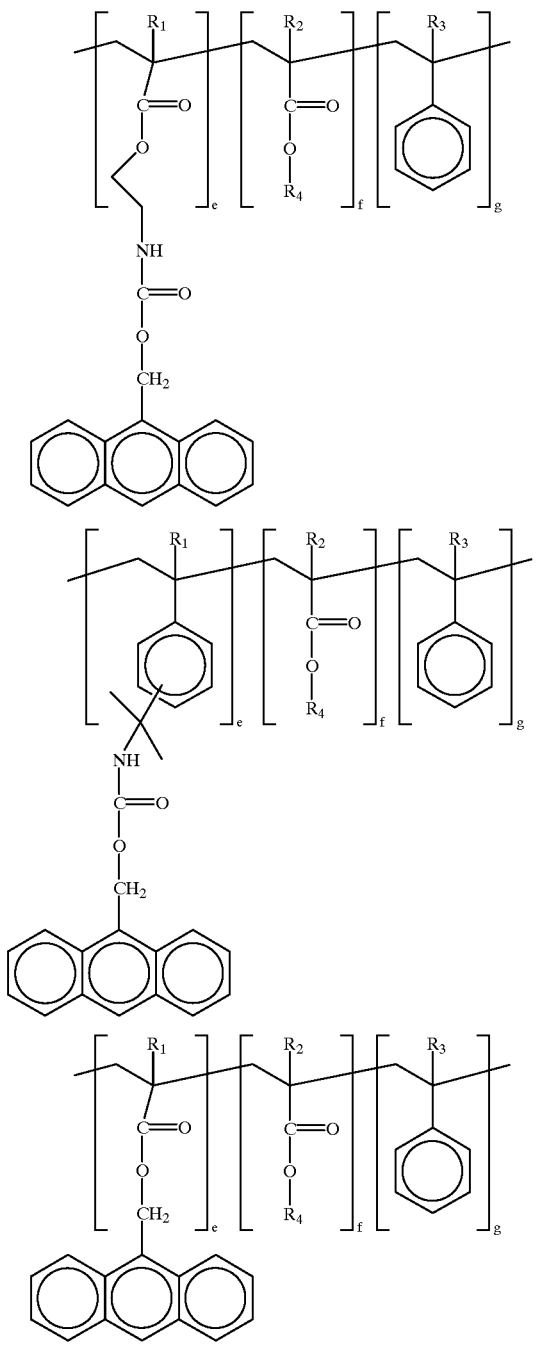

wherein $R_1$, $R_2$ and $R_3$ are independently selected from hydrogen or methyl groups; $R^4$ is a straight or branched-chain $C_1$–$C_{12}$ alkyl group, a $C_5$–$C_8$ cycloalkyl group, the moiety $(CH_2$—$CH_2$—$O)_a$—G, and combinations thereof; wherein G is phenyl or a $C_1$–$C_5$ straight or branched-chain alkyl group; and a is an integer from 1 to 6; and e has a value of 0.1 to 0.5, provided that the sum of e, f and g equal 1.0.

41. The printing plate of claim 38 wherein the polymeric compound containing the thioxanthone moiety has the structure:

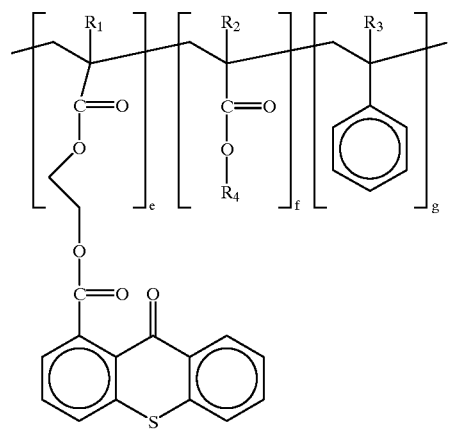

wherein $R_1$, $R_2$ and $R_3$ are independently selected from hydrogen or methyl groups; $R^4$ is a straight or branched-chain $C_1$–$C_{12}$ alkyl group, a $C_5$–$C_8$ cycloalkyl group, the moiety $(CH_2$—$CH_2$—$O)_a$—G, and combinations thereof; wherein G is phenyl or a $C_1$–$C_5$ straight or branched-chain alkyl group; and a is an integer from 1 to 6; and e has a value of 0.1 to 0.5, provided that the sum of e, f and g equal 1.0.

42. The printing plate of claim 24 further comprising a secondary acid generator capable of undergoing an acid-catalyzed reaction to form additional acid.

43. The printing plate of claim 42 wherein the secondary acid generator is selected from acetoacetate, a squaric acid derivative, or an oxalic acid derivative.

44. The printing plate of claim 43 wherein the secondary acid generator is selected from tert-butyl-2-methyl-2-(tosyloxymethyl)-acetoacetate, 2-phenyl-2-(2-tosyloxyethyl)-1,3-dioxolane and a 3,4-dialkoxycyclobut-3-ene-1,2-dione.

45. The printing plate of claim 24 further comprising an indicator dye.

46. The printing plate of claim 45 wherein the indicator dye is selected from CI Basic Blue 7, CI Basic Blue 11, CI Basic Blue 26, CI Disperse Red 1, CI Disperse Red 4 and CI Disperse Red 13.

47. The printing plate of claim 24 wherein the thickness of the radiation-sensitive composition ranges from about 0.5 to 3 micrometers.

48. The composition of claim 1 wherein said first reactive pendant groups are carboxylic acid.

49. The composition of claim 48 wherein said polymer additionally contains second reactive pendant groups capable of undergoing acid-catalyzed condensation with the crosslinking resin at a temperature in the range of about 60–200° C. to form a crosslinked polymer, said second reactive pendant groups selected from the group consisting of hydroxy and alkoxymethyl amide.

50. The composition of claim 49 wherein the crosslinking resin is selected from resole resins, $C_1$–$C_5$ alkoxymethyl melamine resins, $C_1$–$C_5$ alkoxymethyl glycoluril resins, poly($C_1$–$C_5$ alkoxymethyl styrene), polymers of 4-methoxymethyl styrene, polymers of (N-methoxymethyl) acrylamide, polymers of (N-methoxymethyl) methacrylamide, polymers of (N-iso-butoxymethyl) acrylamide, poly($C_1$–$C_5$ alkoxymethyl (meth)acrylamide) derivatives, butylated phenolic resins, and combinations thereof.

51. The composition of claim 50 wherein the thermal-activated acid generator is selected from: straight or branched-chain $C_1$–$C_5$ alkyl sulfonates; aryl sulfonates; straight or branched-chain N—$C_1$–$C_5$ alkylsulfonyl sulfonamides; salts containing an onium cation and non-nucleophilic anion; and combinations thereof.

52. The composition of claim 51 wherein said crosslinking resin is either a resole resin or a butylated phenolic resin.

53. The printing plate of claim 24 wherein said first reactive pendant groups are carboxylic acid.

54. The printing plate of claim 53 wherein said polymer additionally contains second reactive pendant groups capable of undergoing acid-catalyzed condensation with the crosslinking resin at a temperature in the range of about 60–200° C. to form a crosslinked polymer, said second reactive pendant groups selected from the group consisting of hydroxy and alkoxymethyl amide.

55. The printing plate of claim 54 wherein the crosslinking resin is selected from resole resins, $C_1$–$C_5$ alkoxymethyl melamine resins, $C_1$–$C_5$ alkoxymethyl glycoluril resins, poly($C_1$–$C_5$ alkoxymethyl styrene), polymers of 4-methoxymethyl styrene, polymers of (N-methoxymethyl) acrylamide, polymers of (N-methoxymethyl) methacrylamide, polymers of (N-iso-butoxymethyl) acrylamide, poly($C_1$–$C_5$ alkoxymethyl (meth)acrylamide) derivatives, butylated phenolic resins, and combinations thereof.

56. The printing plate of claim 55 wherein the thermal-activated acid generator is selected from: straight or branched-chain $C_1$–$C_5$ alkyl sulfonates; aryl sulfonates; straight or branched-chain N—$C_1$–$C_5$ alkylsulfonyl sulfonamides; salts containing an onium cation and non-nucleophilic anion; and combinations thereof.

57. The printing plate of claim 56 wherein said crosslinking resin is either a resole resin or a butylated phenolic resin.

58. A radiation-sensitive composition comprising:
(a) a thermal-activated acid generator;
(b) a crosslinking resin;
(c) a binder resin comprising a polymer containing reactive pendant groups capable of undergoing acid-catalyzed condensation with the crosslinking resin at a temperature in the range of about 60–200° C. to form a crosslinked polymer; and
(d) an infrared absorber;
wherein said polymer is selected from the group consisting of poly(4-hydroxystyrene/methyl methacrylate), poly(2-hydroxyethyl methacrylate/cyclohexyl methacrylate), poly(2-hydroxyethyl methacrylate/methyl methacrylate), poly(styrene/butyl methacrylate/methyl methacrylate/methacrylic acid), poly(butyl methacrylate/methacrylic acid), poly(vinylphenol/2-hydroxyethyl methacrylate), poly(styrene/n-butyl methacrylate/2-hydroxyethyl methacrylate/methacrylic acid), poly(styrene/ethyl methacrylate/2-hydroxyethyl methacrylate/methacrylic acid, poly(N-methoxymethyl methacrylamide/2-phenylethyl methacrylate/methacrylic acid), poly(2-hydroxyethyl methacrylate/cyclohexyl methacrylate/methacrylic acid), poly(N-methoxymethyl methacrylamide/2-phenylethyl methacrylate/methacrylamide/methacrylic acid), poly(N-methoxymethyl methacrylamide/styrene/butyl methacrylate/methacrylic acid), poly(N-iso-butoxymethyl acrylamide/2-hydroxyethyl methacrylate/methyl methacrylate), and poly(styrene/n-butyl methacrylate/methacrylic acid/N-iso-butoxymethyl methacrylamide).

59. The composition of claim 58 wherein the crosslinking resin is selected from resole resins, $C_1$–$C_5$ alkoxymethyl melamine resins, $C_1$–$C_5$ alkoxymethyl glycoluril resins, poly($C_1$–$C_5$ alkoxymethyl styrene), polymers of 4-methoxymethyl styrene, polymers of (N-methoxymethyl) acrylamide, polymers of (N-methoxymethyl) methacrylamide, polymers of (N-iso-butoxymethyl) acrylamide, poly($C_1$–$C_5$ alkoxymethyl (meth)acrylamide) derivatives, butylated phenolic resins, and combinations thereof.

60. The composition of claim 59 wherein the thermal-activated acid generator is selected from: straight or branched-chain $C_1$–$C_5$ alkyl sulfonates; aryl sulfonates; straight or branched-chain N—$C_1$–$C_5$ alkylsulfonyl sulfonamides; salts containing an onium cation and non-nucleophilic anion; and combinations thereof.

61. The composition of claim 60 wherein said crosslinking resin is either resole resin or a butylated phenolic resin.

62. A printing plate comprising an aluminum substrate having a layer of a radiation-sensitive composition of claim 58.

63. The printing plate of claim 62 wherein the crosslinking resin is selected from resole resins, $C_1$–$C_5$ alkoxymethyl melamine resins, $C_1$–$C_5$ alkoxymethyl glycoluril resins, poly($C_1$–$C_5$ alkoxymethyl styrene), polymers of 4-methoxymethyl styrene, polymers of (N-methoxymethyl) acrylamide, polymers of (N-methoxymethyl) methacrylamide, polymers of (N-iso-butoxymethyl) acrylamide, poly($C_1$–$C_5$ alkoxymethyl (meth)acrylamide) derivatives, butylated phenolic resins, and combinations thereof.

64. The printing plate of claim 63 wherein the thermal-activated acid generator is selected from: straight or branched-chain $C_1$–$C_5$ alkyl sulfonates; aryl sulfonates; straight or branched-chain N—$C_1$–$C_5$ alkylsulfonyl sulfonamides; salts containing an onium cation and non-nucleophilic anion; and combinations thereof.

65. The printing plate of claim 64 wherein said crosslinking resin is either a resole resin or a butylated phenolic resin.

* * * * *